United States Patent
Sugie

(10) Patent No.: US 8,441,217 B2
(45) Date of Patent: May 14, 2013

(54) OSCILLATOR CIRCUIT WITH FREQUENCY SWEEP FUNCTION

(75) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 465 days.

(21) Appl. No.: 12/852,752

(22) Filed: Aug. 9, 2010

(65) Prior Publication Data

US 2011/0285331 A1 Nov. 24, 2011

(30) Foreign Application Priority Data

Aug. 7, 2009 (JP) ................................. 2009-184685
Jul. 15, 2010 (JP) ................................. 2010-160732

(51) Int. Cl.
*H03L 7/06* (2006.01)
*H03B 23/00* (2006.01)

(52) U.S. Cl.
USPC ............................... 318/293; 331/4; 331/178

(58) Field of Classification Search .................. 318/126, 318/130, 400.29, 280, 287, 291, 293, 558, 318/606–608; 331/4, 13, 107 R, 110, 135, 331/136, 138, 177 R, 178, 187
See application file for complete search history.

(56) References Cited

U.S. PATENT DOCUMENTS

| | | | | |
|---|---|---|---|---|
| 4,001,726 A * | 1/1977 | Sandford et al. | ............... | 331/178 |
| 4,346,352 A * | 8/1982 | Baetke | ........................ | 331/178 |
| 4,417,218 A * | 11/1983 | Berke | ........................ | 331/178 |
| 4,603,305 A * | 7/1986 | McCune | ........................ | 331/4 |
| 4,931,749 A * | 6/1990 | Walters | ........................ | 331/4 |
| 5,225,794 A * | 7/1993 | Skalka et al. | ............... | 331/178 |

FOREIGN PATENT DOCUMENTS

| | | |
|---|---|---|
| JP | 62-272616 A | 11/1987 |
| JP | 2005-49970 A | 2/2005 |
| JP | 2008-54220 A | 3/2008 |

* cited by examiner

*Primary Examiner* — Bentsu Ro
(74) *Attorney, Agent, or Firm* — Cantor Colburn LLP

(57) ABSTRACT

With an oscillator circuit with a frequency sweep function, a first counter counts a reference clock for a number of counts that corresponds to a digital first setting signal, and generates a first count completion signal which is asserted on completion of the count. A D/A converter converts a digital second setting signal into an analog control voltage. A VCO oscillates with a frequency according to the control voltage. When the first count completion signal is asserted, the VCO is reset. An output combining unit receives the output signal of the VCO, generates the output signal of the oscillator circuit, and generates the first setting signal and the second setting signal.

11 Claims, 6 Drawing Sheets

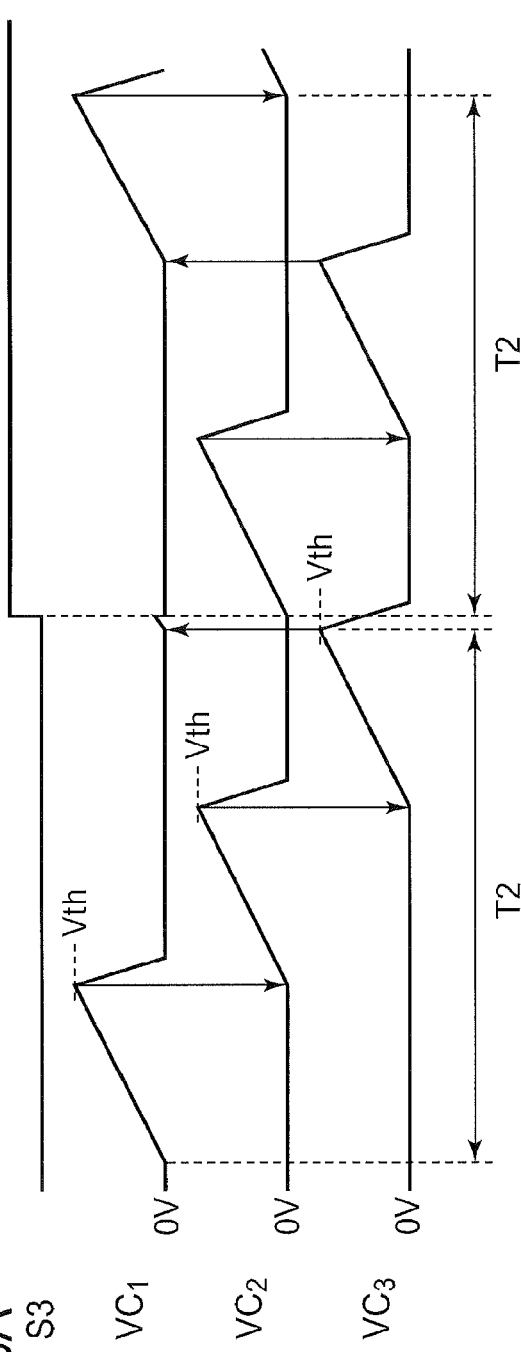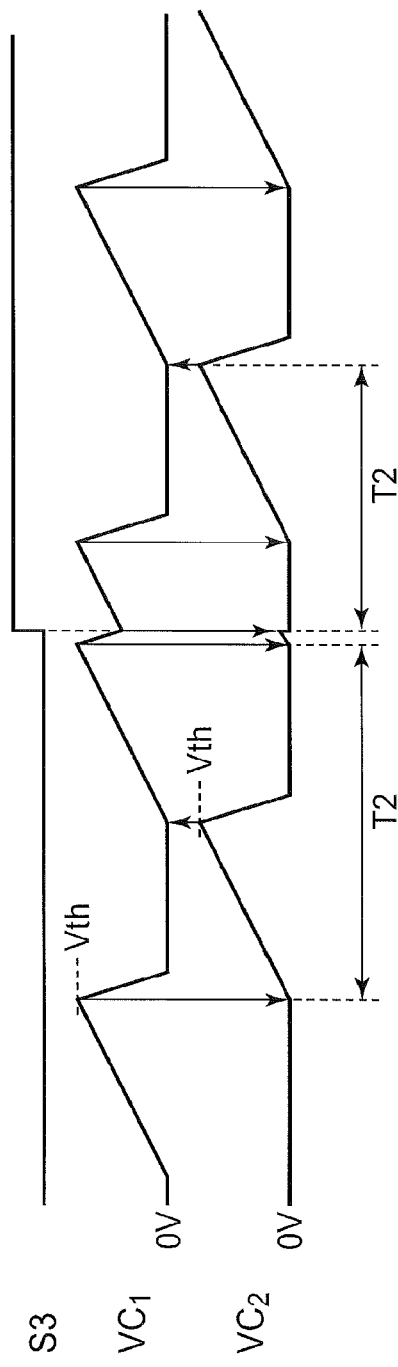

OSCILLATOR CIRCUIT WITH FREQUENCY SWEEP FUNCTION

BACKGROUND OF THE INVENTION

1. Field of the Invention

The present invention relates to an oscillator circuit which is capable of sweeping the frequency.

2. Description of the Related Art

In some cases, in electronic circuits, there is a demand to sweep the frequency of a cyclic pulse signal or a sine wave signal. An oscillator having an extremely simple frequency sweep function includes a VCO (Voltage Controlled Oscillator) configured to oscillate with a frequency that corresponds to an input control voltage. By sweeping the control voltage for the VCO, such an arrangement is capable of sweeping the frequency of the output signal of the VCO.

RELATED ART DOCUMENTS

Patent Documents

[Patent Document 1]
 Japanese Patent Application Laid Open No. 2005-049970
[Patent Document 2]
 Japanese Patent Application Laid Open No. S62-272616
[Patent Document 3]
 Japanese Patent Application Laid Open No. 2008-054220

The input voltage sensitivity (output frequency change with respect to the input voltage) of the VCO is not constant. Accordingly, such a method has a problem in that the range of high precision frequency sweeping is limited by the input voltage range of the VCO. In other words, if the frequency is to be swept over a certain wide frequency range, there is a need to change the control voltage for the VCO with high precision over a wide range. In a case in which the control voltage is generated using a D/A converter, together with the increase in the number of bits of the D/A converter, such an arrangement requires the D/A converter to have higher precision. Even if a high-precision D/A converter is employed, there are irregularities in the frequency precision of the output signal of the VCO in a range on the order of ±5-10%.

SUMMARY OF THE INVENTION

The present invention has been made in view of such a situation. It is an exemplary purpose of the present invention to provide an oscillator circuit which is capable of sweeping the frequency with high precision.

An embodiment of the present invention relates to an oscillator circuit with a frequency sweep function. The oscillator circuit comprises: a first counter configured to count a reference clock for a number of counts that corresponds to a digital first setting signal, and to generate a first count completion signal which is asserted on completion of the count; a D/A converter configured to convert a digital second setting signal into an analog control voltage; a voltage controlled oscillator configured to oscillate with a frequency that corresponds to the control voltage, and to be reset when the first count completion signal is asserted; and an output combining unit configured to receive an output signal of the voltage controlled oscillator, to generate an output signal of the oscillator circuit with a frequency sweep function, and to generate the first and second setting signals.

Such an embodiment is capable of sweeping the high-precision period (frequency) component in fine increments by means of the voltage control oscillator (VCO), as well as sweeping the coarse period (frequency) component in coarse increments by means of the first counter. As a result, such an embodiment allows the voltage range of the control voltage for the VCO to be reduced. Thus, such an embodiment allows the required number of bits of the D/A converter to be reduced.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5A is a time chart which shows the operation of the VCO shown in FIG. 4, and FIG. 5B is a time chart which shows the operation of an arrangement according to a comparison technique employing two capacitors.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
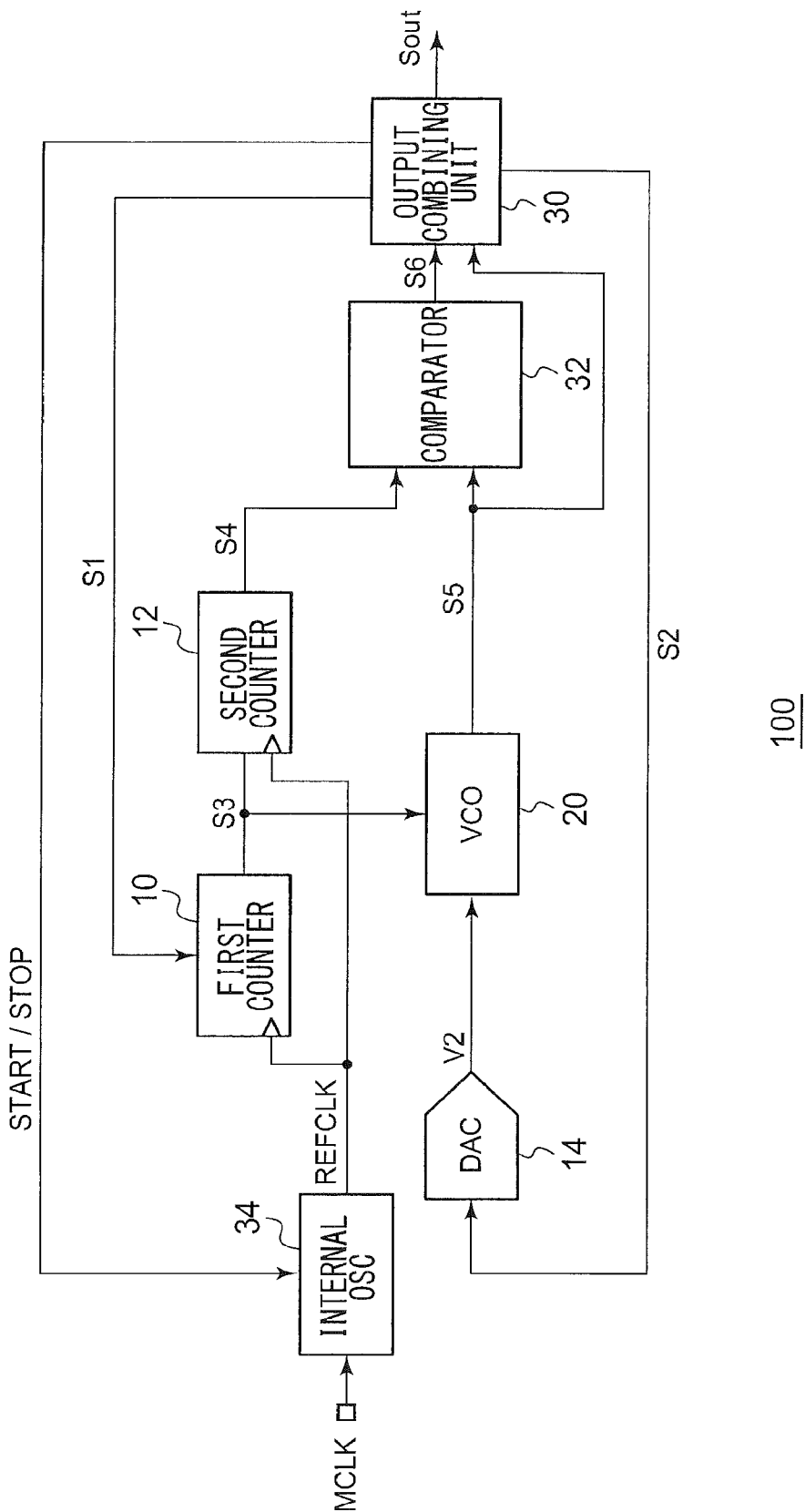
FIG. 1 is a block diagram which shows a configuration of an oscillator circuit according to an embodiment.

FIG. 1 is a block diagram which shows a configuration of an oscillator circuit 100 according to an embodiment. The oscillator circuit 100 generates a cyclic output signal Sout, and has a function of sweeping the frequency Fout thereof. The period Tout is the reciprocal of the frequency Pout. In order to understand the oscillator circuit 100 according to the embodiment, it is convenient to direct attention to the period of each signal rather than the frequency.

The oscillator circuit 100 includes a first counter 10, a second counter 12, a D/A converter 14, a VCO 20, an output combining unit 30, a phase comparison unit 32, and an internal oscillator 34.

The internal oscillator 34 generates a reference clock REFCLK having a predetermined first frequency. The internal oscillator 34 receives an external master clock MCLK, and generates the reference clock REFCLK in synchronization with the master clock MCLK thus received. Furthermore, the internal oscillator 34 is configured to be capable of calibrating the frequency Fref of the reference clock REFCLK using the master clock MCLK. The reference clock REFCLK thus generated by the internal oscillator 34 has a high-precision reference period Tref (=1/Fref). Description will be made below regarding an arrangement in which Tref=0.3 μsec. it should be noted that the internal oscillator 34 may oscillate asynchronously to the master clock MCLK.

The first counter 10 counts the reference clock REFCLK M times (M is an integer), which is a number that corresponds to a first setting signal S1 provided in the form of a digital signal. The first counter 10 generates a first count completion signal S3 which is asserted (set to high level) on completion of the count. That is to say, the first count completion signal S3 is asserted every first period T1. Here, the relation T1=M×Tref is satisfied.

The D/A converter 14 converts a digital second setting signal S2 into an analog control voltage V2. The VCO 20 oscillates with a frequency (period T2) that corresponds to the control voltage V2, and generates a cyclic signal S5. For example, it can be supposed that, as the second setting signal S2 is changed by 1 LSB, the period T2 of the output signal S5 of the VCO 20 changes by 0.5 nsec.

The VCO 20 receives the first setting signal S1 from the first counter 10. When the first count completion signal S3 is asserted, the VCO 20 is reset.

The output combining unit 30 receives the output signal S5 of the VCO 20, and generates an output signal Sout of the oscillator circuit 100, which has a sweep function. Furthermore, the output combining unit 30 generates the first setting signal S1 and the second setting signal S2.

Specifically, the output combining unit 30 generates the output signal Sout having a period represented by the Expression Tout=T1+T2.

Figure 2:
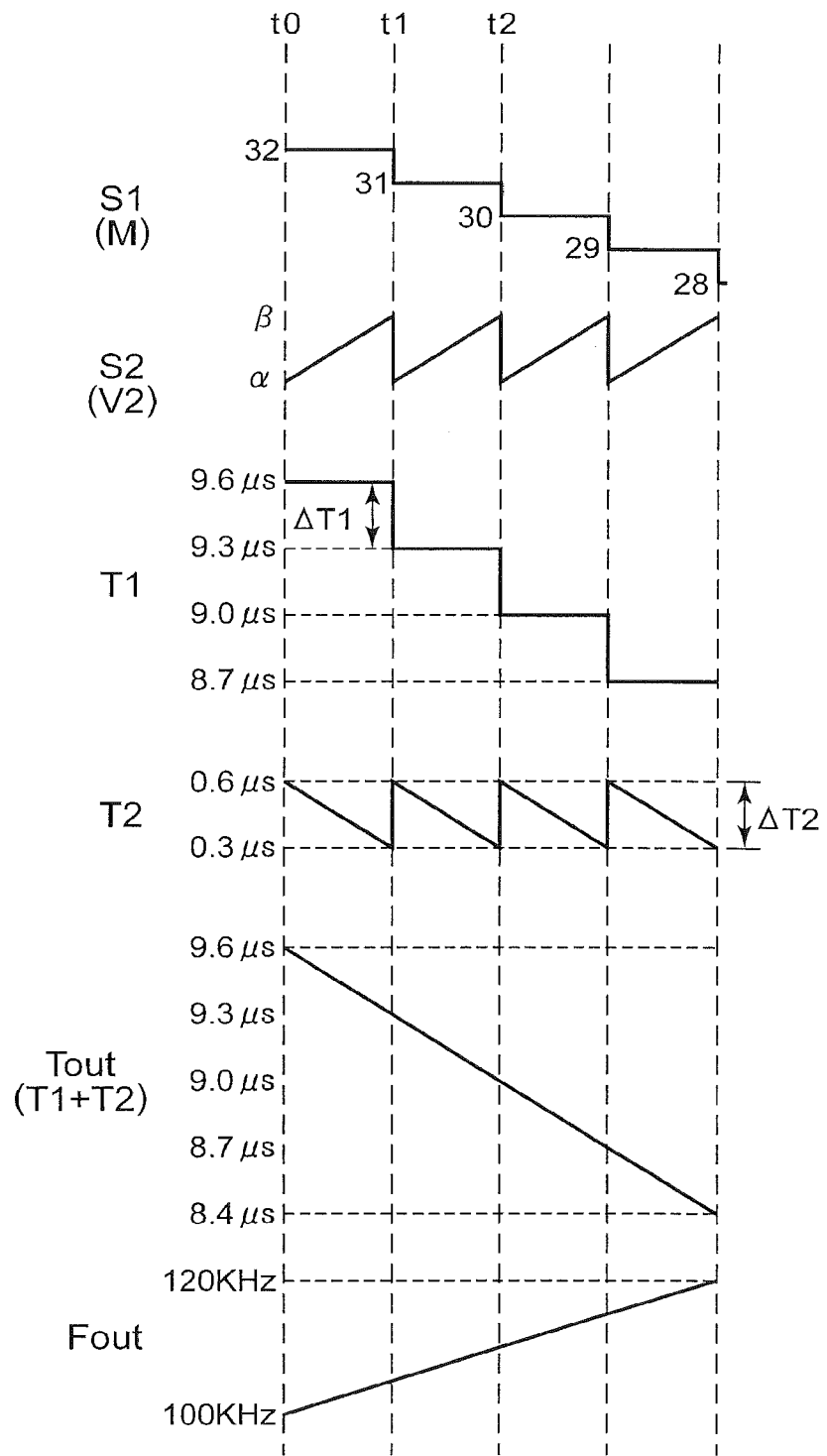
FIG. 2 is a time chart which shows the operation of the oscillator circuit shown in FIG. 1.

The above is the basic configuration of the oscillator circuit 100. Next, description will be made regarding the operation thereof. FIG. 2 is a time chart which shows the operation of the oscillator circuit 100 shown in FIG. 1. The time chart shown in FIG. 1 illustrates an operation in which the frequency of the output signal Sout is swept up (the period is shortened).

The oscillator circuit 100 reduces the period Tout of the output signal Sout from 10.2 μsec in 0.1 nsec steps. The initial value of the first setting signal S1 is set to 32, and the initial value of the second setting signal S2 is set to α. When the second setting signal S2 is set to the initial value α, the period T2 of the output signal S5 of the VCO 20 is set to 0.6 μsec.

At the time point t0, the output combining unit generates a start signal START. When the start signal START is generated, the internal oscillator 34 starts to generate the reference clock REFCLK.

During an interval from the time point t0 to the time point t1, the number M to be counted by the first counter 10 is set to 32. That is to say, T1 is set to 32×0.3 μsec=0.96 μsec. During the interval from the time point t0 to the time point t1, the first counter 10 repeatedly generates the first count completion signal S3 with a period of T1.

The VCO 20 starts counting every time the first count completion signal S3 is asserted. During the interval from the time point t0 to the time point t1, the second setting signal S2 increases monotonically. Furthermore, the control voltage V2 increases according to the increase in the second setting signal S2. That is to say, the oscillation frequency of the VCO 20 increases over time, and accordingly, the period T2 thereof gradually shortens from 0.6 μsec over time.

The period Tout of the output signal Sout output from the output combining unit 30 satisfies the relation Tout=T1+T2. That is to say, during the interval from the time point t0 to the time point t1, the period Tout gradually shortens from 9.6 μsec toward 9.3 μsec. The frequency Fout of the output signal Sout gradually increases from 100 kHz.

The change width ΔT2 of the period T2 that accompanies the sweeping of the second setting signal S2 is equal to the step width ΔT1 of the period T1. At the time point t1 when the period T2 of the output signal S5 of the VCO 20 reduces to 0.3 μsec, the output combining unit 30 decrements, by one, the first setting signal S1 for the first counter 10, thereby setting the count value M of the first counter 10 to 31.

During the interval from the time point t1 to t2, the period T1 is set to 9.3 μsec. In the same way as in the interval from the time point t0 to the time point t1, the period T2 is swept from 0.6 μsec to 0.3 μsec. As a result, the period Tout of the output signal Sout is swept from 9.3 μsec to 9.0 μsec.

The oscillator circuit 100 repeatedly performs the aforementioned processing.

With such an arrangement, the T1 component can be changed with a coarse resolution (300 nsec) by changing the first setting signal S1. Furthermore, such an arrangement is capable of changing the T2 component with high resolution (0.5 nsec) by changing the second setting signal S2 by means of the VCO 20.

That is to say, such an arrangement is capable of sweeping the high-precision period (frequency) component in fine increments by means of the VCO 20, and also of sweeping the coarse period (frequency) component in coarse increments by means of the first counter 10. As a result, such an arrangement allows the voltage range of the control voltage V2 for the VCO 20 to be reduced. Thus, such an arrangement allows the number of bits required for the D/A converter to be reduced.

Furthermore, such an arrangement allows the most suitable region of the input voltage range of the VCO 20 (the region where the input voltage sensitivity exhibits high linearity and/or where the optimum voltage sensitivity is provided for the resolution of the D/A converter 14) to be selectively employed. Thus, such an arrangement provides improved precision of the output signal Sout.

In a case in which the frequency is to be swept down, which is the opposite of the operation shown in FIG. 2, the first setting signal S1 and the second setting signal S2 should be changed such that they are the opposite of what is shown in FIG. 2.

Next, specific description will be made regarding a more suitable configuration of the oscillator circuit 100. The oscillator circuit 100 further includes a second counter and a phase comparison unit 32, in addition to the aforementioned components.

The second counter 12 counts the reference clock REFCLK a predetermined number of times K (K is an integer). With a suitable arrangement, when the frequency is swept up, K is set to 1, and when the frequency is swept down, K is set to 2.

When the first count completion signal S3 is asserted, the second counter 12 starts counting. The second counter 12 generates a second count completion signal S4 which is asserted upon completion of the count.

The phase comparison unit 32 receives the second count completion signal S4 and the output signal S5 of the VCO 20. The phase comparison unit 32 makes a comparison between the phase of the output signal S5 and the phase of the second count completion signal S4, and generates a phase comparison signal S6 which is asserted when a predetermined relation is satisfied (e.g., when these phases match).

The output combining unit 30 generates the first setting signal S1 and the second setting signal S2 based upon the phase comparison signal S6. Specific description will be made regarding the processing performed by the output combining unit 30.

The output combining unit 30 sweeps the second setting signal S2 while maintaining a state in which the value of the first setting signal S1 is fixed. When the phase comparison signal S6 is asserted, the output combining unit 30 changes the value of the first setting signal S1 by a predetermined amount, and resets the second setting signal S2. Subsequently, the output combining unit 30 sweeps the second setting signal S2 again, starting from the initial value.

The above is the specific configuration of the oscillator circuit 100.

Figure 3A:
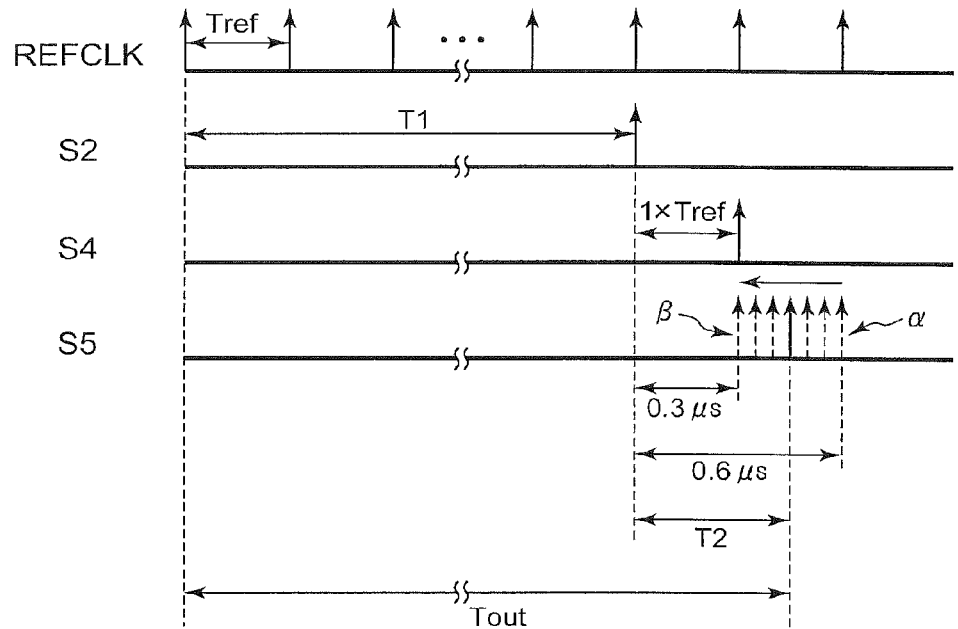
FIGS. 3A and 3B are diagrams showing the operations related to a second counter and a phase comparison unit shown in FIG. 1.
Figure 3B:
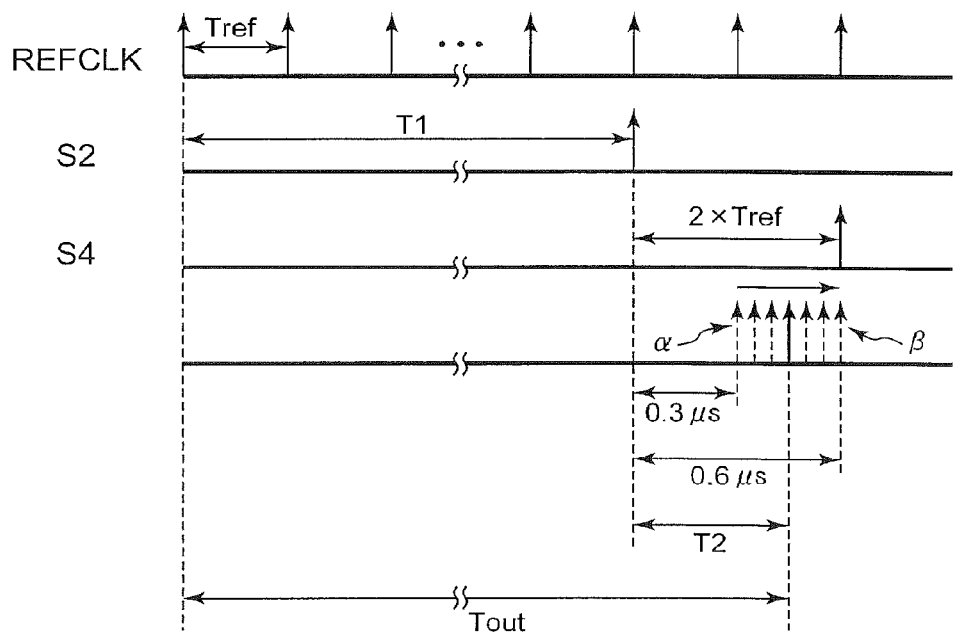

FIGS. 3A and 3B are diagrams showing the operations related to the second counter 12 and the phase comparison unit 32 shown in FIG. 1. FIG. 3A shows the operation when the frequency is swept up, and FIG. 3B shows the operation when the frequency is swept down.

Description will be made with reference to FIG. 3A. When the frequency is swept up, the period T2 of the output signal S5 of the VCO 20 shortens in 0.5 nsec steps from the value (0.6 ec) that corresponds to the initial value α of the second setting signal S2. After an interval (Tref×1) elapses after the second setting signal S2 is asserted, the second count completion signal S4 is asserted. That is to say, when the period T2 of the output signal S5 shortens to 0.3 μsec as a result of the sweeping operation, the timing at which the second count completion signal S4 is asserted matches the timing at which the output signal S5 is asserted. When the timings match, the phase comparison signal S6 is asserted. The timings at which the phase comparison signal S6 is asserted correspond to the time points t1, t2, t3, and so on, in the time chart shown in FIG. 2.

Description will be made with reference to FIG. 3B. When the frequency is swept down, the period T2 of the output signal S5 of the VCO 20 is increased in 0.5 nsec steps from the value (0.3 μsec) that corresponds to the initial value α of the second setting signal S2. After an interval (Tref×2) elapses after the second setting signal S2 is asserted, the second count completion signal S4 is asserted. That is to say, when the period T2 of the output signal S5 is increased to 0.6 μsec as a result of the sweeping operation, the timing at which the second count completion signal S4 is asserted matches the timing at which the output signal S5 is asserted.

As can be clearly understood from FIGS. 3A and 3B, by providing the second counter 12 and the phase comparison unit 32, such an arrangement is capable of suitably detecting the timing at which the first setting signal S1 for the first counter 10 is to be changed.

Figure 4:
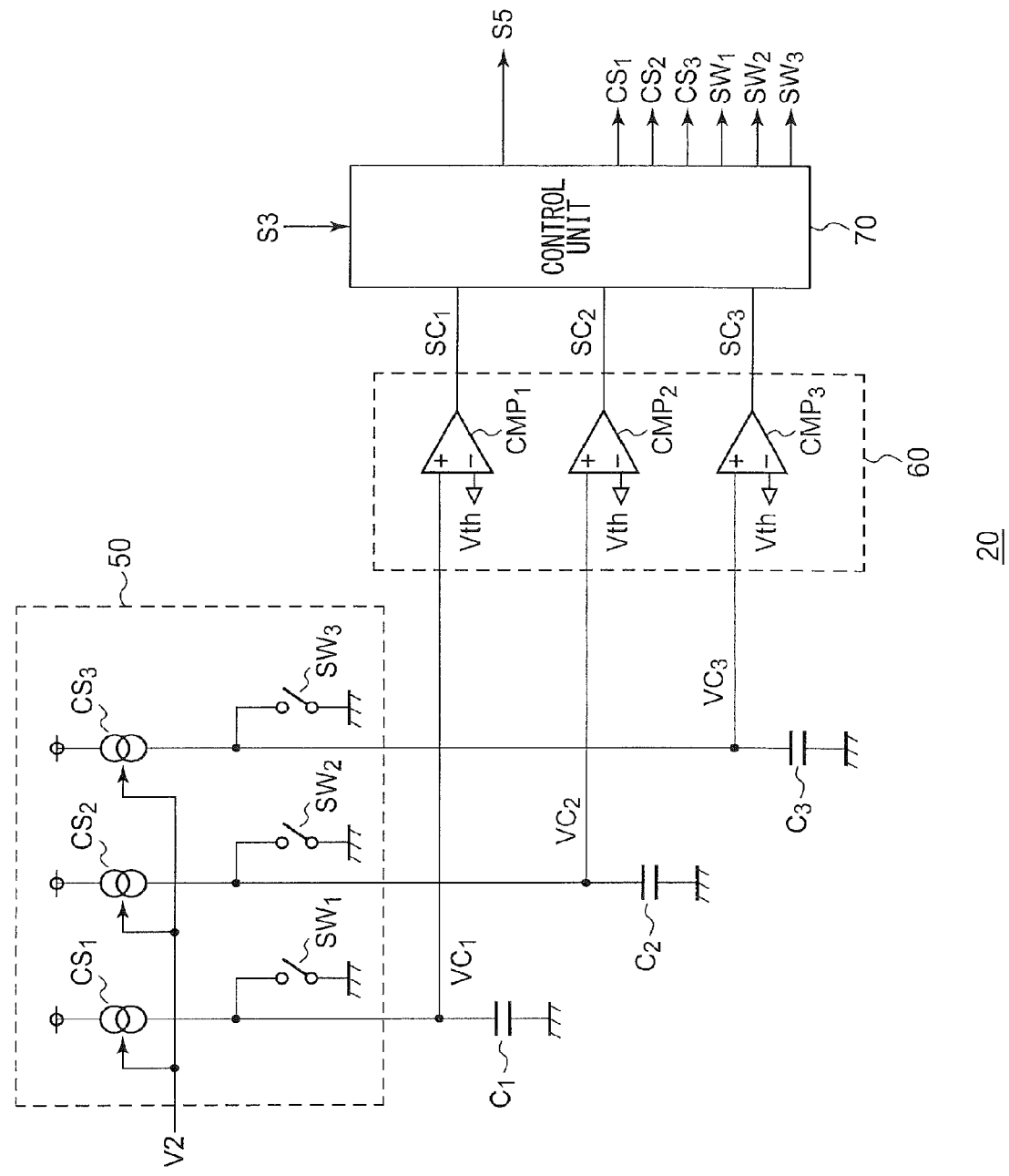
FIG. 4 is a circuit diagram which shows an example configuration of a VCO shown in FIG. 1.

FIG. 4 is a circuit diagram which shows an example configuration of the VCO 20 shown in FIG. 1. It should be noted that the configuration of the VCO 20 is not restricted to such a configuration shown in FIG. 4.

The VCO 20 includes N (N is an integer of 3 or more) capacitors C1 through CN, a charge/discharge circuit 50, a voltage comparison unit 60, and a control unit 70. FIG. 4 shows an arrangement in which N=3.

The capacitors C1 through C3 are each arranged such that one terminal thereof is grounded and is set to a fixed voltage.

The charge/discharge circuit 50 charges/discharges each of the capacitors C1 through C3. The charge/discharge circuit 50 includes current sources CS1 through CS3, and switches SW1 through SW3.

The current sources CS1 through CS3 each generate a constant current Ic that corresponds to the control voltage V2. The current sources CS1 through CS3 are each configured to control the ON/OFF operation independently according to a control signal received from the control unit 70. When the i-th (1≦i≦3) current source CSi is turned on, the capacitor Ci is charged using a constant current Ic.

Furthermore, the switches SW1 through SW3 are each configured to independently turn on and off according to the control signal received from the control unit 70. When the i-th (1≦i≦3) switch SWi is turned on, the capacitor Ci is discharged.

The voltage comparison unit 60 compares a predetermined threshold voltage Vth with the voltages VC1 through VC3 that occur at the other terminals of the respective capacitors C1 through C3. The voltage comparison unit 60 generates voltage comparison signals SC1 through SC3 for capacitors C1 through C3, respectively, each of which is asserted when the corresponding voltage VC matches the threshold voltage Vth.

The control unit 70 controls the charge/discharge circuit 50 according to the voltage comparison signals SC1 through SC3 and the first count completion signal S3.

The control unit 70 repeatedly executes the following steps for the multiple capacitors C1 through C3 in a cyclic manner.

1. The i-th capacitor Ci is charged via a current that corresponds to the control voltage V2, i.e., the second setting signal S2.

2. When either the voltage comparison signal SCi that corresponds to the i-th capacitor Ci or the first count completion signal S3 is asserted, the charging operation for the (i+1)-th capacitor Ci+1 is started. Furthermore, the i-th capacitor Ci is discharged.

The VCO 20 shown in FIG. 4 generates the output signal S5 with a period T2 which is equal to an interval from the start of the charging operation for a given capacitor Ci to the start of the next charging operation for the same capacitor Ci.

FIG. 5A is a time chart which shows the operation of the VCO 20 shown in FIG. 4. The VCO 20 shown in FIG. 4 is capable of resetting the oscillation operation every time the first count completion signal S3 is asserted. The advantage of the VCO 20 shown in FIG. 4 can be clearly understood in comparison with the following comparison technique.

FIG. 5B is a time chart showing the operation of an arrangement according to such a comparison technique employing two capacitors. With such an arrangement in which two capacitors are employed, when the first count completion signal S3 is asserted in the charging operation for a given capacitor C2, the charging operation for the other capacitor C1 is started. However, the voltage VC1 at the capacitor C1 is not completely discharged at the timing at which the first count completion signal S3 is asserted, and thus, such an arrangement has a problem in that the period T2 of the next output signal S5 shortens. In contrast, the VCO 20 shown in FIG. 4 has the advantage of providing an output signal S5 having a stabilized period regardless of the reset timing (timing at which the first count completion signal S3 is asserted).

Figure 6:
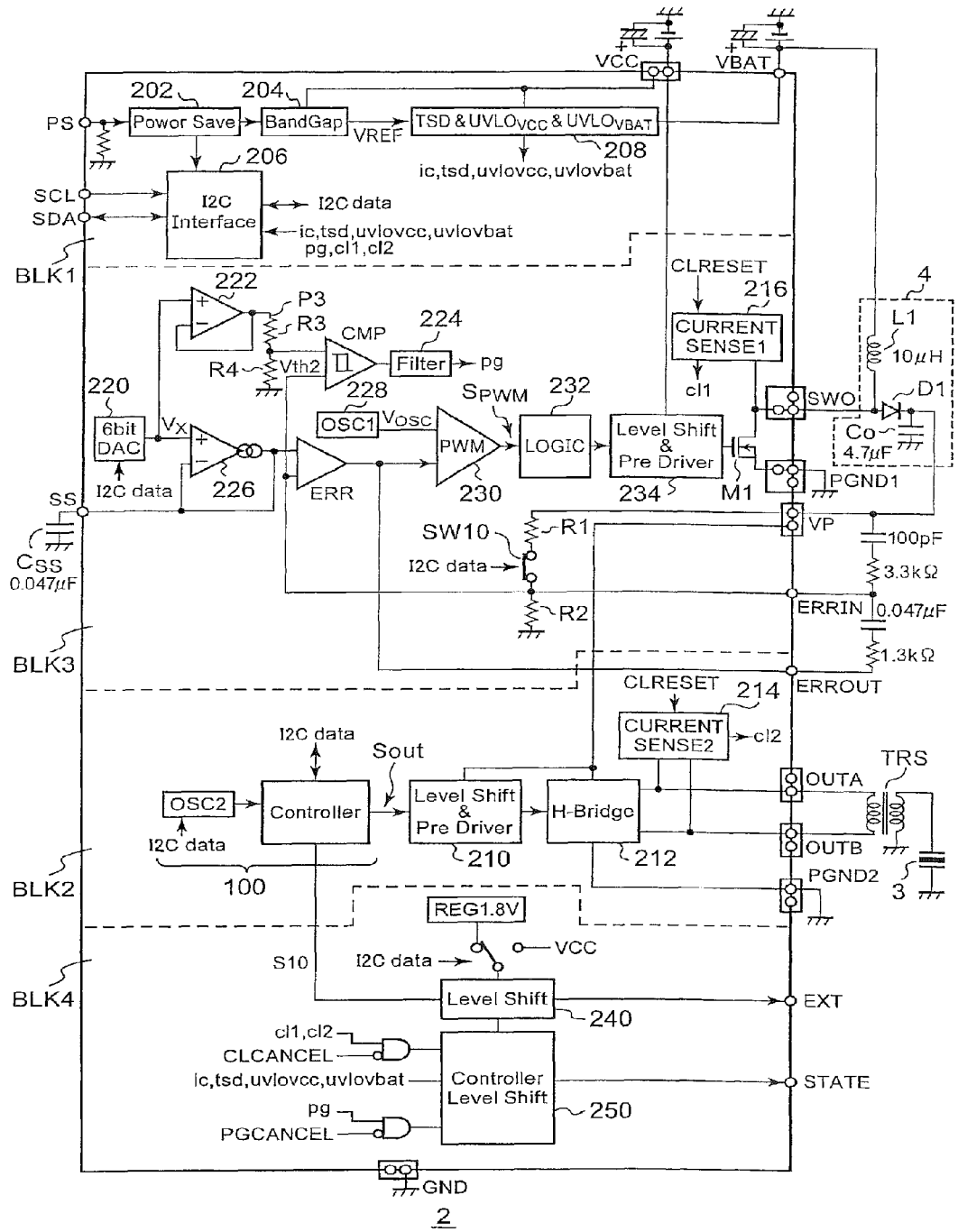
FIG. 6 is a circuit diagram which shows a configuration of an H-bridge driver including an oscillator circuit according to an embodiment.

Lastly, description will be made regarding an example of an application of the oscillator circuit according to an embodiment. FIG. 6 is a circuit diagram which shows a configuration of an H-bridge driver including the oscillator circuit 100 according to an embodiment.

The H-bridge driver 2 has four broad categories of functions. Description will be made below regarding the configurations related to these functions in order.

1. Block Related to a Power Saving Interface (BLK1)

A PS signal is input to a power saving terminal PS. The control IC 200 is instructed to switch the state thereof to the active state or the standby state according to the PS signal. A power supply voltage VCC is supplied to a power supply terminal VCC, and a battery voltage VBAT is supplied to a battery terminal VBAT.

The power saving control unit 202 monitors the PS signal, and controls the active state and the standby state. Upon receiving an instruction to switch to the active state, the power saving control unit 202 transmits a notice to a band gap reference circuit 204 and an I2C interface circuit 206. Upon receiving the notice, the band gap reference circuit 204 starts up, and generates a reference voltage VREF. Furthermore, this enables the I2C interface circuit 206 to perform data transmission with an external circuit.

A protection circuit 208 detects abnormal temperatures at the control IC 200, and executes thermal shutdown (TSD) protection. Furthermore, the protection circuit 208 detects low voltage lockout states for each of the power supply voltage VCC and the battery voltage VBAT. A signal tsd, which indicates an abnormal temperature, and signals uvlovcc and uvlovbat, which respectively indicate low voltage states of the power supply voltage VCC and the battery voltage VBAT, are transmitted to an external circuit via the I2C interface circuit 206. After a predetermined period of time elapses after the PS signal switches from the standby state to the active state, the protection circuit 208 asserts an is signal, thereby switching the control IC 200 to the active state.

2. H-Bridge Driver Block (BLK2)

The H-bridge driver block includes the oscillator circuit 100 according to the embodiment described above.

The output signal Sout of the oscillator circuit 100 is input to a level shifter/pre-driver circuit 210. Furthermore, the oscillator circuit 100 outputs data S10 which indicates whether or not the frequency is being swept.

The level shifter/pre-driver circuit 210 level-shifts the output signal Sout, and outputs the resulting output signal Sout to an H-bridge circuit 212 provided as a downstream component. The output terminals OUTA and OUTB of the H-bridge circuit 212 are connected to a primary coil of a transformer TRS. The secondary coil of the transformer TRS is connected to a piezoelectric element (motor) 3. A current detection circuit 214 detects an overcurrent state, and generates a signal c12 that indicates the detection result. The current detection circuit 214 is reset according to a CLRESET signal.

3. DC/DC converter block

The DC/DC converter block generates a power supply voltage VP for the H-bridge circuit 212. An output circuit 4 for the DC/DC converter, which is provided as an external component, is connected to the DC/DC converter block, i.e., the block BLK3. The output voltage VP of the DC/DC converter is input to the power supply terminals of the H-bridge circuit 212 and the level shifter/pre-driver circuit 210. A switching transistor M1 is provided between a switch-out terminal SWO and a ground terminal PGND1. A current detection circuit 216 detects an overcurrent state in the switching transistor M1, and generates a signal C11 that indicates the detection result. The current detection circuit 216 is reset according to a CLRESET signal.

A 6-bit D/A converter 220 generates a setting voltage Vx that corresponds to the data input via the I2C interface. Resistors R1 and R2 divide the output voltage VP so as to generate an ERRIN voltage. A buffer amplifier 222 and resistors R3 and R4 divide the instruction voltage Vx so as to generate a threshold voltage Vth2. A hysteresis comparator CMP compares the ERRIN voltage with the threshold voltage Vth2. Based upon the comparison result, when the output voltage VP is equal to or greater than 90% of the setting voltage (target voltage), a power-good signal pg is asserted (set to high level), and when the output voltage VP is equal to or smaller than 70% of the setting voltage, the power-good signal pg is negated (set to low level). A noise removal filter 224 is provided as a downstream component of the hysteresis comparator CMP.

A gm amplifier 226 receives the setting voltage Vx. A soft-start terminal SS is connected to an external capacitor Css. The gm amplifier 226 and the capacitor Css generate a gradually-rising soft-start voltage Vx' at the startup time. After a soft-start time Tss elapses, the soft-start voltage Vx' becomes equal to the setting voltage Vx.

Using the setting voltage Vx, the output current Iout of the gm amplifier 226, and the capacitance of the capacitor Css, the soft-start time Tss is represented by the Expression Tss=Vx/Tout×Css.

The setting voltage Vx', which is the output voltage of the gm amplifier 226, is input to an error amplifier ERR. The error amplifier ERR amplifies the difference between the ERRIN voltage and the setting voltage Vx', and outputs an ERROUT voltage. An oscillator 228 generates a cyclic voltage Vosc having a triangle waveform or a sawtooth waveform. A PWM comparator 230 compares the ERROUT voltage with the cyclic voltage Vosc, and generates a PWM signal SPWM.

A capacitor (100 pF) and a resistor (3.3 kΩ) are arranged as external elements between the VP terminal and the ERRIN terminal so as to form a phase compensation component. Furthermore, a capacitor (0.047 µF) and a resistor (1.3 kΩ) are arranged as external elements between the ERRIN terminal and the ERROUT terminal so as to form a phase compensation component. A logic unit 232 and a level shifter/pre-driver circuit 234 perform a switching operation for the switching transistor M1 according to the PWM signal.

4. Block Related to Logic Output (BLK3)

An EXT terminal is a terminal via which the data S10, which indicates whether or not the frequency is being swept, is output to an external circuit. The data S10 is level-shifted to either the stabilized voltage of 1.8 V or the power supply voltage VCC, and then output via the EXT terminal. A controller/level shifter 250 receives various kinds of detection signals, i.e., cl1, cl2, and the power-good signal pg generated by the control IC 200, and outputs these detection signals and the power-good signal to an external circuit via a STATE terminal. The detection signals c11 and c12 are masked by a CLCANCEL signal, and the power-good signal pg is masked by a PGCANCEL signal.

Also, instead of the output voltage VP of the DC/DC converter, the battery voltage VBAT or the power supply voltage VCC may be employed as the power supply voltage for the H-bridge circuit 212 in the H-bridge driver block (BLK2). In this case, the VP terminal should be connected to the VBAT terminal or the VCC terminal, and the operation of the DC/DC converter block (BLK2) should be stopped. In this case, by turning off a switch SW10, such an arrangement prevents the flow of unnecessary current through the resistors R1 and R2.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding an arrangement in which the frequency is swept. Also, the oscillator circuit 100 shown in FIG. 1 can be suitably employed for the use of generating a cyclic signal Sout having a fixed frequency.

While the preferred embodiments of the present invention have been described using specific terms, such description is for illustrative purposes only, and it is to be understood that changes and variations may be made without departing from the spirit or scope of the appended claims.

What is claimed is:

1. A method for generating a cyclic signal the frequency of which is swept, the method comprising:
counting a reference clock by means of a first counter for a number of counts that corresponds to a digital first setting signal, and generating a first count completion signal which is asserted on completion of the count;
converting a digital second setting signal into an analog control voltage;
resetting when the first count completion signal is asserted; and
generating the cyclic signal according to an output signal of a voltage controlled oscillator configured to oscillate with a frequency that corresponds to the control voltage, and generating the first and second setting signals.

2. A method according to claim 1, further comprising:
starting counting by means of a second counter configured to count the reference clock for a predetermined number of counts when the first count completion signal is asserted, and to generating a second count completion signal which is asserted on completion of the count; and
making a comparison between the phase of the second count completion signal and the phase of the output signal of the voltage controlled oscillator, and generating a phase comparison signal which is asserted when the aforementioned phases match,
wherein the first and second setting signals are generated based upon the phase comparison signal.

3. A method according to claim 2, wherein the operation for generating the first and second setting signals comprises:
sweeping the second setting signal while maintaining a state in which the value of the first setting signal is fixed; and
an operation in which, when the phase comparison signal is asserted, the value of the first setting signal is changed by a predetermined amount, the second setting signal is reset, and the second setting signal thus reset is swept again.

4. An oscillator circuit with a frequency sweep function, comprising:
a first counter configured to count a reference clock for a number of counts that corresponds to a digital first setting signal, and to generate a first count completion signal which is asserted on completion of the count;
a D/A converter configured to convert a digital second setting signal into an analog control voltage;
a voltage controlled oscillator configured to oscillate with a frequency that corresponds to the control voltage, and to be reset when the first count completion signal is asserted; and
an output combining unit configured to receive an output signal of the voltage controlled oscillator, to generate an output signal of the oscillator circuit with a frequency sweep function, and to generate the first and second setting signals.

5. An oscillator circuit according to claim 4, further comprising:
a second counter configured to count the reference clock for a predetermined number of counts, to start counting when the first count completion signal is asserted, and to generate a second count completion signal which is asserted on completion of the count; and
a phase comparator configured to make a comparison between the phase of the second count completion signal and the phase of the output signal of the voltage controlled oscillator, and to generate a phase comparison signal which is asserted when the aforementioned phases match,
wherein the output combining unit generates the first and second setting signals based upon the phase comparison signal.

6. An oscillator circuit according to claim 5, wherein the output combining unit is configured to sweep the second setting signal while maintaining a state in which the value of the first setting signal is fixed,
and wherein the output combining unit is further configured such that, when the phase comparison signal is asserted, the value of the first setting signal is changed by a predetermined amount, the second setting signal is reset, and the second setting signal thus reset is swept again.

7. An oscillator circuit according to claim 5, wherein, when the frequency is swept up, the second counter counts the reference clock once,
and wherein, when the frequency is swept down, the second counter counts the reference clock twice.

8. An oscillator circuit according to claim 5, wherein the voltage controlled oscillator comprises:
N (N is an integer which is equal to or greater than 3) capacitors each of which is arranged such that the electric potential at one terminal thereof is fixed;
a charge/discharge circuit configured to charge and discharge the N capacitors;
a voltage comparison unit configured to compare the voltage that occurs at the other terminal of each of the N capacitors with a predetermined threshold voltage, and to generate, for each capacitor, a voltage comparison signal which is asserted when these two voltages match; and
a control unit configured to control the charge/discharge circuit according to the voltage comparison signals and the first count completion signal,
and wherein the voltage controlled oscillator is configured to output a signal that corresponds to the voltage comparison signal that corresponds to one capacitor,
and wherein the control unit repeatedly executes, in order and in a cyclic manner,
charging the i-th ($1 \leq i \leq N$) capacitor using a current that corresponds to the second setting signal,
starting a charging operation for the (i+1)-th capacitor and discharging the i-th capacitor when at least one signal from among the voltage comparison signal that corresponds to the i-th capacitor and the first count completion signal is asserted.

9. A motor driving apparatus comprising:
a transformer arranged such that a secondary coil thereof is connected to a motor to be driven;
an H-bridge circuit arranged such that an output terminal thereof is connected to a primary coil of the transformer;
an oscillator circuit according to claim 4; and
a level shifter configured to receive an output signal of the oscillator circuit, and to level-shift the output signal thus received so as to drive the H-bridge circuit.

10. A motor driving apparatus according to claim 9, further comprising a DC/DC converter configured to receive an external DC voltage, to perform one from among boosting and stepping down the DC voltage thus received, and to supply the resulting DC voltage to power supply terminals of the level shifter and the H-bridge circuit.

11. A motor driving apparatus according to claim 10, wherein the DC/DC converter is configured such that the state thereof can be switched between an active state and an inactive state, and such that it comprises two resistors and a switch arranged in series between a terminal via which an output voltage is to be output and a ground terminal, and wherein, in the active state of the DC/DC converter, the switch is turned on, and the output voltage is adjusted such that a voltage divided by the two resistors matches a setting voltage, and wherein, in the inactive state of the DC/DC converter, the switch is turned off, and an external DC voltage is supplied to the power supply terminals of the level shifter and the H-bridge circuit.

\* \* \* \* \*